(12) United States Patent
Lee et al.

(10) Patent No.: US 7,608,874 B2
(45) Date of Patent: Oct. 27, 2009

(54) FULLY ISOLATED PHOTODIODE STACK

(75) Inventors: Jong-Jan Lee, Camas, WA (US);
Douglas J. Tweet, Camas, WA (US);
Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 350 days.

(21) Appl. No.: 11/657,152

(22) Filed: Jan. 24, 2007

(65) Prior Publication Data
US 2007/0218613 A1    Sep. 20, 2007

Related U.S. Application Data

(63) Continuation-in-part of application No. 11/580,407, filed on Oct. 13, 2006, now Pat. No. 7,470,946, which is a continuation-in-part of application No. 11/499,081, filed on Aug. 4, 2006, now Pat. No. 7,233,036, which is a continuation-in-part of application No. 11/416,742, filed on May 3, 2006, which is a continuation-in-part of application No. 11/384,110, filed on Mar. 17, 2006, now Pat. No. 7,419,844.

(51) Int. Cl.
*H01L 31/062* (2006.01)
*H01L 31/113* (2006.01)

(52) U.S. Cl. .............. 257/292; 257/290; 257/293; 438/48; 438/66

(58) Field of Classification Search .............. 257/290, 257/292, 293, 294, E21.63; 438/48, 66, 69, 438/75
See application file for complete search history.

(56) References Cited

U.S. PATENT DOCUMENTS 5,016,108 A  *  5/1991  Akimoto et al. ............. 348/302

(Continued)

OTHER PUBLICATIONS

V.A. Gergel', A.V. Lependin, Yu. I. Tishin, I.V. Vanyushin, and V.A. Zimoglyad, "Boron Distribution Profiling in Asymmetrical $n^+$-p Silicon Photodiodes and New Creation Concept of Selectively Sensitive Photoelements for Megapixel Color Photoreceivers," Proc. of SPIE vol. 6260. pp. 62600C-1 to 62600C-8 (2006).

(Continued)

*Primary Examiner*—Phuc T Dang
(74) *Attorney, Agent, or Firm*—Law Office of Gerald Maliszewski; Gerald Maliszewski

(57) ABSTRACT

An array of fully isolated multi-junction complimentary metal-oxide-semiconductor (CMOS) filterless color imager cells is provided, together with an associated fabrication method. The method provides a bulk silicon (Si) substrate. A plurality of color imager cells are formed, either in the Si substrate, or in a single epitaxial Si layer formed over the substrate. Each color imager cell includes a photodiode set with a first, second, and third photodiode formed as a stacked multi-junction structure. A U-shaped (in cross-section) well liner, fully isolates the photodiode set from adjacent photodiode sets in the array. For example, each photodiode is formed from a p doped Si layer physically interfaced to a first wall. A well bottom physically interfaces to the first wall, and the p doped Si layer of the third, bottom-most, photodiode is part of the well bottom. Then, the photodiode sets may be formed from an n/p/n/p/n/p or n/p/p−/p/p−/p layered structure.

24 Claims, 7 Drawing Sheets

U.S. PATENT DOCUMENTS

| | | | |
|---|---|---|---|
| 6,727,521 B2 | 4/2004 | Merrill | 257/98 |
| 6,934,050 B2 | 8/2005 | Merrill et al. | 358/1.16 |
| 6,960,757 B2 | 11/2005 | Merrill et al. | 250/226 |
| 7,244,646 B2 * | 7/2007 | Patrick et al. | 438/237 |
| 2006/0082670 A1 * | 4/2006 | Parks | 348/311 |

OTHER PUBLICATIONS

Tarek Lule', Stephan Benthien, Holger Keller, Frank Mutze, Peter Rieve, Konstantin Seibel, Michael Sommer, and Markus Bohm, Sensitivity of CMOS Based Imagers and Scaling Perspectives, IEEE Trans. Electron Devices, vol. 47, No. 11, pp. 2110-2122 (2000).

* cited by examiner

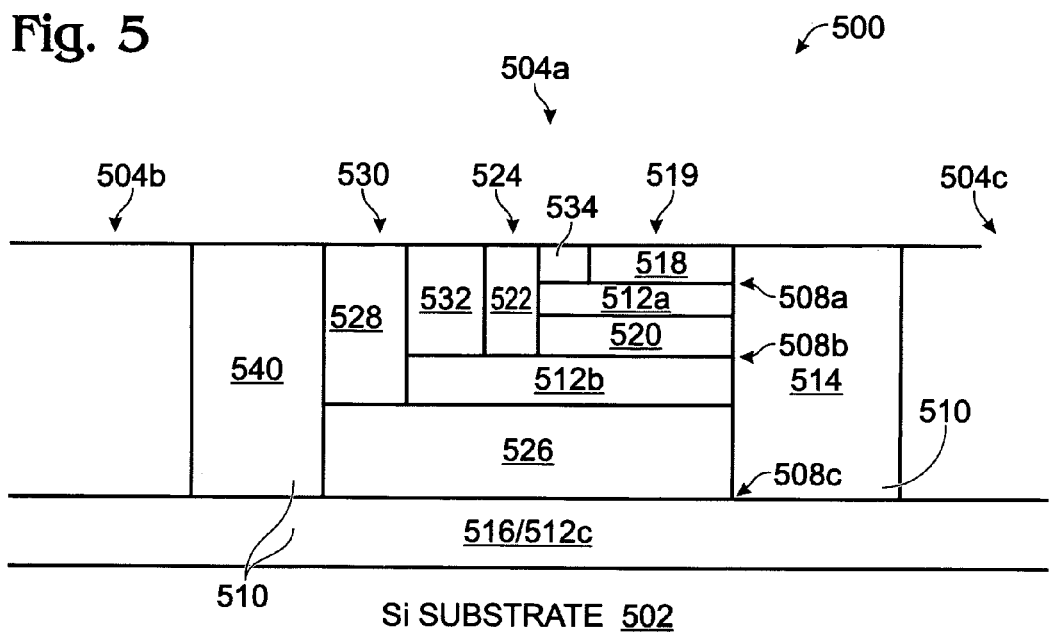
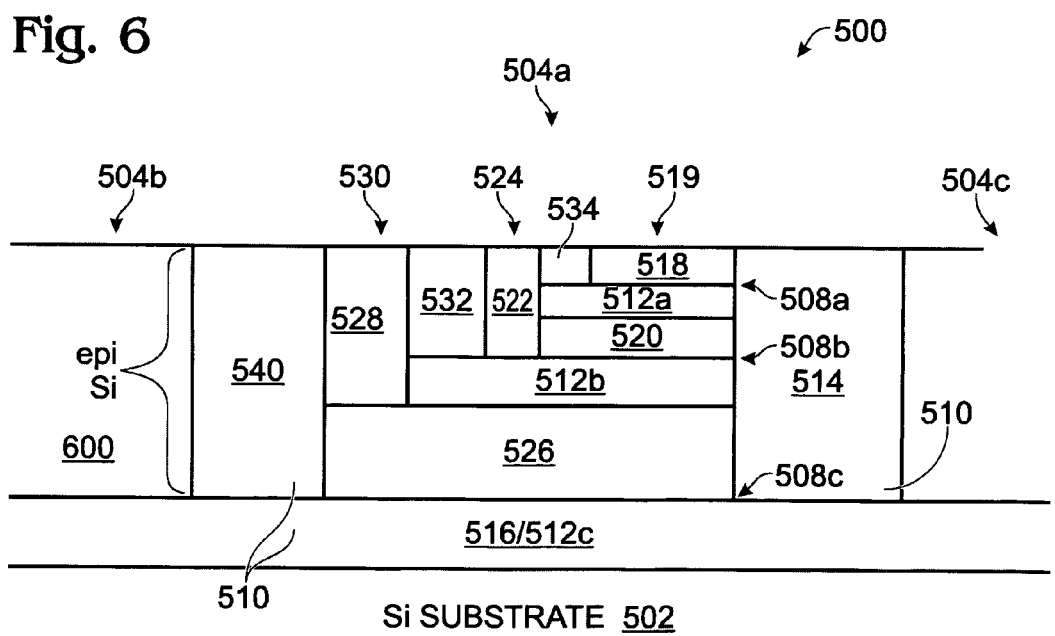

US 7,608,874 B2

FULLY ISOLATED PHOTODIODE STACK

RELATED APPLICATIONS

This application is a Continuation-in-Part of a patent application entitled, TRIPLE-JUNCTION FILTERLESS CMOS COLOR IMAGER CELL, invented by Hsu et al., Ser. No. 11/580,407, filed Oct. 13, 2006, now U.S. Pat. No. 7,470,946 which is a Continuation-in-Part of a patent application entitled, DOUBLE-JUNCTION FILTERLESS CMOS COLOR IMAGER CELL, invented by Hsu et al., Ser. No. 11/499,081, filed Aug. 4, 2006, now U.S. Pat. No. 7,233,036 which is a Continuation-in-Part of a pending patent application entitled, WIDE OUTPUT SWING CMOS IMAGER, invented by Lee et al., Ser. No. 11/416,742, filed May 3, 2006, which is a Continuation-in-Part of a patent application entitled, A REAL-TIME CMOS IMAGER HAVING STACKED PHOTODIODES FABRICATED ON SOI WAFER, invented by Lee et al., Ser. No. 11/384,110, filed Mar. 17, 2006, now U.S. Pat. No. 7,419,814.

All of the above-mentioned applications are incorporated herein by reference.

BACKGROUND OF THE INVENTION

1. Field of the Invention

This invention generally relates to complementary metal/oxide/semiconductor (CMOS) imaging sensors and, more particularly, to a structure and associated fabrication process for forming an well liner to isolate imager pixel photodiode sets in an array of photodiode sets.

2. Description of the Related Art

Silicon has characteristic photon absorption lengths that vary with the energy of the photons absorbed. For the wavelengths of 450 nanometers (nm), 550 nm, and 650 nm, the absorption lengths are 0.24 microns (μm), 1.13 μm, and 3.17 μm, respectively. This variation provides an opportunity to fabricate stacked diode junctions at depths that are capable of separating photons of various wavelengths, using standard CMOS manufacturing processes. Various technologies have been applied to this idea over the past 30 years and full color imaging is available in the market place.

FIG. 1 is a partial cross-sectional view of a stacked set of photodiodes formed in a Si-on-insulator (SOI) substrate (prior art). The photodiode set 100 includes three stacked photodiodes 102, 104, and 106. The blue color sensing photodiode (102) is fabricated on a silicon layer, while the green and red color sensing photodiodes (104 and 106, respectively) are fabricated in the Si substrate. The photodiode set is controlled by a transistor set, which is represented in this figure by transistor 108.

FIG. 2 is a schematic drawing depicting a triple cathode photodiode imager (prior art). In U.S. Pat. Nos. 6,727,521 and 6,960,757, Merrill et al. disclose a filterless color CMOS imager cell having an n1/p1/n2/p2/n3/p-substrate structure. The pixel consists of five (5) junctions. All the p-type layers are grounded. The n1/p1 interface forms a junction for blue diode. The green diode is formed by the parallel combination of the n2/p1 and n2/p2 junctions. The red diode is formed by the parallel combination of the n3/p2 and n3-p-substrate junctions. The n2/p1 and n2/p2 diodes have a common cathode and the anodes are all grounded.

FIG. 3 is a partial cross-sectional view of device based upon the schematic of FIG. 2 (prior art). As in FIG. 2, the triple cathode device has an n/p/n/p/n/p layered structure with three p-layers connected to a common ground. The three n-layers are the cathodes for the blue, green, and red diodes, and are connected to their respective active pixel sensor (APS) circuits. One problem associated with this structure is its complicated process steps. Two silicon epitaxial (epi) processes and multiple ion implantations are needed. One epi layer is formed between the blue and green diode junctions, and another epi layer is formed between the green and red diode junctions. Additionally, there is no structure isolating the green and red diodes from the neighboring pixel set. This lack of isolation decreases the spatial resolution of the imager sensor.

FIG. 15 is a partial cross-sectional view of a triple cathode photodiode set with partial isolation (prior art). The p+ substrate prevents cross-talk between adjacent photodiode sets (not shown) through the underlying substrate. P doped regions 207 and 208 form a partial vertical wall. However, regions 201, 203, and 204, between 207 and 205, and between 208 and 205 are lightly p (p−) doped. This p/p−/p/p−/p/p−/p+ (207-201-205-203-208-204-p+) structure forms electron channels in the p-areas (201,202, and 204). Therefore, photo electrons in one pixel can diffuse to neighboring pixel. That is, although pn depletion layer thickness does not extend to adjacent pixels, the electron diffusion length in the p layers is long, permitting photo electrons to be collected by adjacent pixels.

Digital camera technology is based upon the conflicting goals of increasing the pixel count, decreasing the chip size, and improving the signal-to-noise ratio. Higher pixel counts and smaller chip sizes mean that unit senor area (the diode area) must be made smaller. When light strikes the diode, the photo electrons are generated and collected to the cathode. The photo electrons generate the signal. Undesirably, the signal-to-noise ratio decreases with smaller diode sizes, if the noise remains constant. One way to increase the signal is to use the area outside the diode to collect the photo electrons at the cathode. Regions 201, 203 and 204 are areas that extend outside the photodiode (past regions 207 and 208) that can absorb photons. Photo electrons generated in regions 201, 203 and 204 diffuse into the diode and are collected by the cathodes. Therefore, the signal is improved (increased). However, as described above, regions 201, 203 and 204 can be an electron channel between adjacent pixels, and degrade resolution.

Double junction and triple junction photodiodes with shared or independent color pixel sensor output are disclosed in the parent applications mentioned above in the Related Applications Section. The process steps for these devices are much simpler than the triple cathode structure shown in FIG. 3. The separation of the blue, green, and red signals is performed by the APS circuit, and these three signals are integrated and readout sequentially. Therefore, the use of an external mechanical shutter for "still" shot imaging remains a problem. Additionally, the pixel size is relatively large because of the isolation required between pixels in an array.

FIG. 4 is a partial cross-sectional view of a triple cathode structure, fabricated without the use of an n/p/n/p/n/p layered structure, as proposed by Gergel et al (prior art). Photogenerated electrons are collected on the cathode by the long electron diffusion length in the lightly p-typed doped layer. The separation of the blue, green, and red photon-generated electrons is by the p+-p junction. Although BB_1 (Buried barrier) separates blue and green photon-generated electrons, and BB_2 separates green and red photon-generated electrons, there are no structures to completely prevent unintended electron flow through the substrate to neighboring red diode junctions.

It would be advantageous if a multi-junction photodiode color imager array could be fabricated with a minimum number of process steps, using a structure to insure isolation between neighboring pixel cells.

SUMMARY

Accordingly, a method is provided for forming an array of fully isolated multi-junction complimentary metal-oxide-semiconductor (CMOS) filterless color imager cells. The method provides a bulk silicon (Si) substrate. A plurality of color imager cells are formed, either in the Si substrate, or in a single epitaxial Si layer formed over the substrate. Each color imager cell includes a photodiode set with a first, second, and third photodiode formed as a stacked multi-junction structure. A U-shaped well liner fully isolates the photodiode set from adjacent photodiode sets in the array.

Each photodiode is formed from a p doped Si layer physically interfaced to a first wall well liner. The well liner also includes a well bottom physically interfaced to the first wall, and the p doped Si layer of the third, bottom-most, photodiode is part of the well bottom. In one aspect, the photodiode set forms an n/p/n/p/n/p layered structure. In another aspect, an n/p/p−/p/p−/p structure is formed.

Additional details of the above described method, and an array of fully isolated multi-junction CMOS filterless color imager cells are provided below.

BRIEF DESCRIPTION OF THE DRAWINGS

FIG. 5 is a partial cross-sectional view of an array of fully isolated multi-junction complimentary metal-oxide-semiconductor (CMOS) filterless color imager cells.

FIG. 6 is a partial cross-sectional view depicting a variation of the array of FIG. 5.

DETAILED DESCRIPTION

Figure 1:
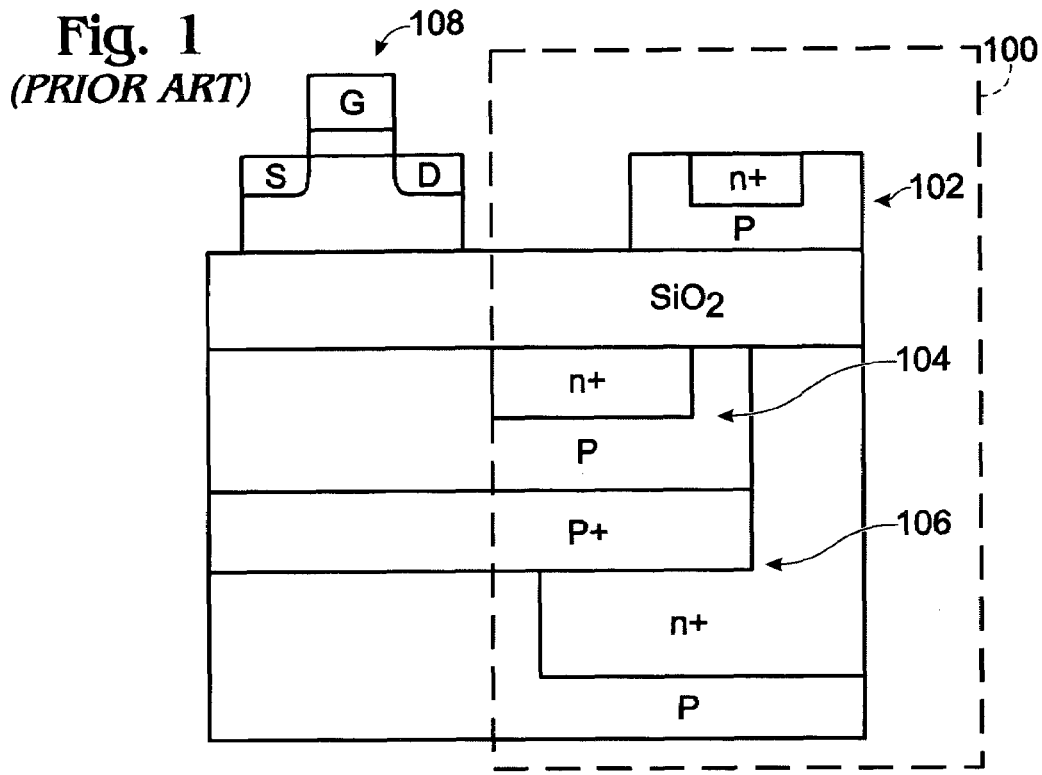
FIG. 1 is a partial cross-sectional view of a stacked set of photodiodes formed in a Si-on-insulator (SOI) substrate (prior art).
Figure 2:
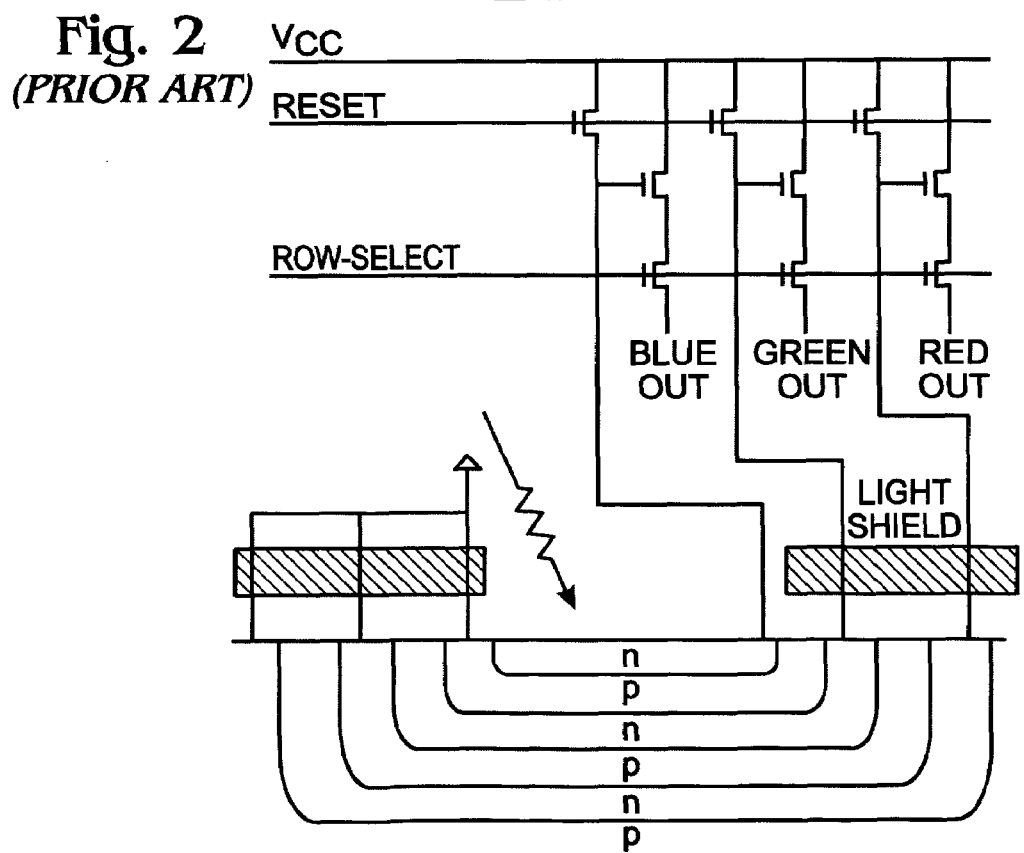
FIG. 2 is a schematic drawing depicting a triple cathode photodiode imager (prior art).
Figure 3:
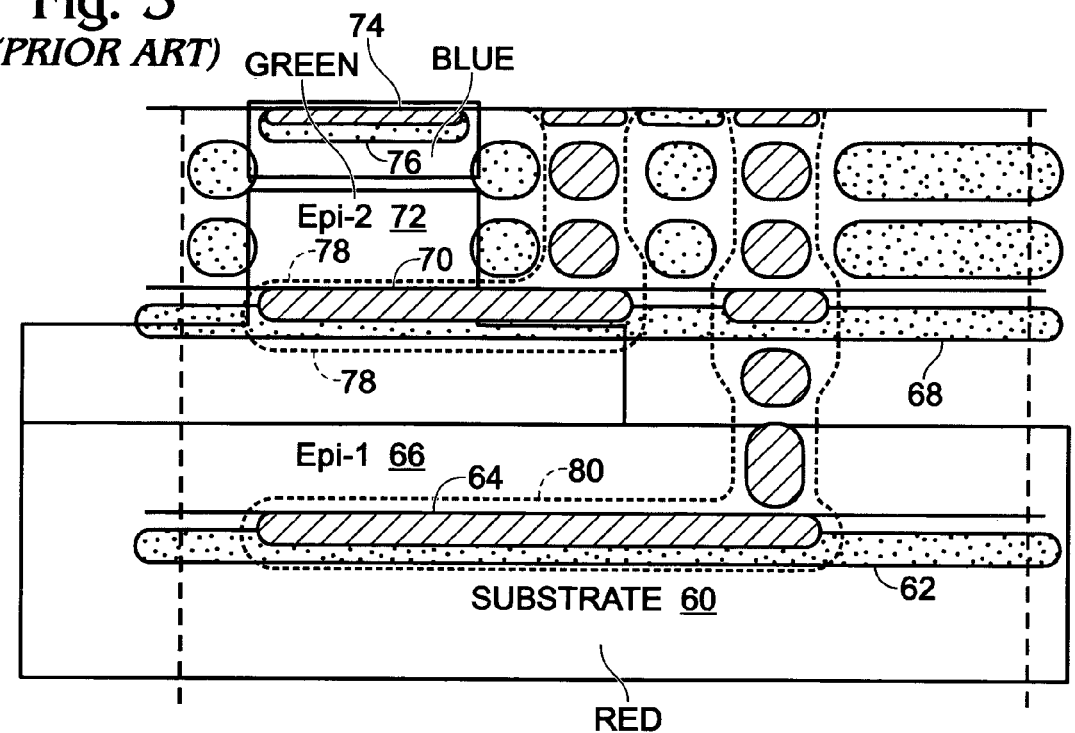
FIG. 3 is a partial cross-sectional view of device based upon the schematic of FIG. 2 (prior art).
Figure 4:
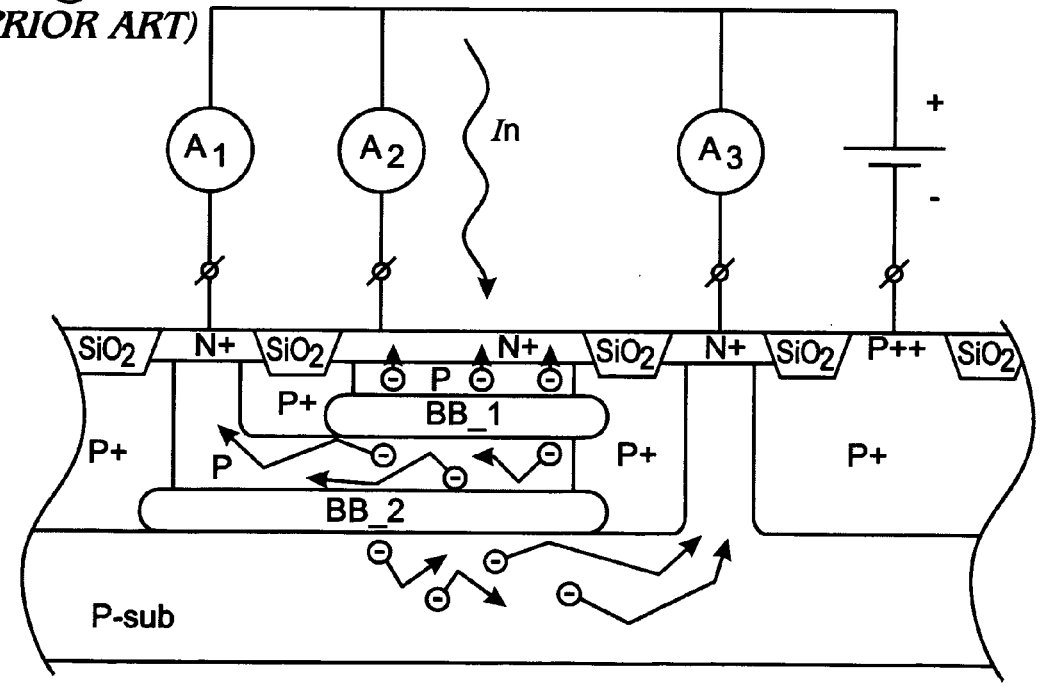
FIG. 4 is a partial cross-sectional view of a triple cathode structure, fabricated without the use of an n/p/n/p/n/p layered structure, as proposed by Gergel et al (prior art).

FIG. 5 is a partial cross-sectional view of an array of fully isolated multi-junction complimentary metal-oxide-semiconductor (CMOS) filterless color imager cells. The array 500 is comprised of a bulk silicon (Si) substrate 502. A plurality of color imager cells 504 are formed in the substrate 502. Although only three cells are shown (504a, 504b, and 504c), it should be understood that the array may be comprised of a much larger number cells configured in matrix, where each cell is identified by a position in a row and column. Each color imager cell 504 includes a photodiode set with a first photodiode 508a, second photodiode 508b, and third photodiode 508c formed as a stacked multi-junction structure.

A U-shaped well liner 510 is formed in the Si substrate 502, fully isolating the photodiode set from adjacent photodiode sets in the array. For example, the well liner 510 isolates the photodiode set of cell 504a from the photodiode set of cells 504b and 504c. Although the well liner 510 is depicted as having a U-shape in cross-section, it should be understood that if the cells are viewed in three dimensions, then the well liners would more closely resemble a cup-shape or a rectangle with a bottom.

Each photodiode 508 includes a doped Si layer 512 physically interfacing the well liner 510. Doped Si layer 512a is part of photodiode 508a, doped Si layer 512b is part of photodiode 508b, and doped layer 512c is part of photodiode 508c. More explicitly, the well liner 510 includes a first wall 514 physically interfacing to a doped Si layer of each photodiode in the photodiode set. In this example of the invention, each photodiode 508 includes a p doped Si 512 layer physically interfacing the well liner first wall 514. The well liner 510 is also p doped and electrically connected to a reference voltage, such as ground. As used herein, a heavily doped region, e.g., a heavily p doped region, is referred to as p+ (p+doped), and is associated with dopant concentrations in the range of about $1 \times 10^{19}$ to $1 \times 10^{21}$ cm$^{-3}$. Regions with this degree of dopant are often contact areas. A moderately doped region, e.g., a moderately p doped region, is referred to as p (p doped), and is associated with dopant concentrations in the range of about $5 \times 10^{16}$ to $1 \times 10^{19}$ cm$^{-3}$. A lightly doped region, e.g., a lightly p doped region, is referred to as p−(p−doped), and is associated with dopant concentrations in the range of about $1 \times 10^{15}$ to $5 \times 10^{16}$ cm$^{-3}$.

The well liner 510 also includes a well bottom 516 physically interfacing the first wall 514. The third, bottom-most, photodiode 508c includes p doped layer 512c that is part of the well bottom 516. The first photodiode 508a includes a first doped Si layer 518 formed in a top surface region 519. Underlying first doped Si layer 518 is the first p doped Si layer 512a, which physically interfaces to the first wall 514. The second photodiode includes a second doped Si layer 520 underlying the first p doped Si layer 512a. An underlying second p doped Si layer 512b physically interfaces to the first wall 514. An n doped first vertical structure 522 physically interfaces the second doped Si layer 520 to a top surface region 524.

The third photodiode 508c includes a third doped Si layer 526 underlying the second p doped Si layer 512b. The underlying third p doped Si layer 512c physically interfaces to the first wall 514 and forms a portion of the well bottom 516. An n doped second vertical structure 528 physically interfaces the third doped Si layer 526 to a top surface region 530. The well liner 510 also includes a p doped second wall 540 physically interfacing the second vertical structure 528, the third doped Si layer 526, and the well bottom 516. Note: the first wall 514 of photodiode set 504a and the second wall of photodiode set 504c are a continuous structure forming a vertical wall of the U-shaped well liner. Additional, as described below, the pixel transistors may be fabricated overlying the p doped vertical wall of the U-shaped well liner.

In one aspect, the first doped Si layer 518, second doped Si layer 520, and third doped Si layer 526 are all n doped. In another aspect, the first doped Si layer 518 is n doped, while the second doped Si layer 520 and third doped Si layer 526 are p-doped.

Isolating structure 532 separates the first vertical structure 522 and second vertical structure 528. Isolating structure 534 separates the first vertical structure 522 and the first doped Si layer 518. Isolating structures 532 and 534 are made from a dielectric material, such a silicon dioxide for example, p doped Si, or a combination of dielectric material and p doped Si. Detailed examples of the isolating structures are presented below. Although not shown in this figure, but presented in detail below, an oxide or dielectric material trench may also formed over the well liner walls 514 and 540.

FIG. 6 is a partial cross-sectional view depicting a variation of the array of FIG. 5. In this aspect, the photodiode set 506 multi-junction structure is formed in a single layer of epitaxial (epi) Si 600 overlying the Si substrate 502. Typically, at least a portion of the well liner walls 514 and 540 are also formed in the epi Si 600. Although the well bottom 516 is shown as formed in the Si substrate 502, all or part of the well bottom 516 may alternately be formed in the epi Si 600. Alternately but not shown, the well bottom 516 may be formed in the Si substrate 502, while the well liner walls 514 and 540 are formed in both the epi Si 600 and the Si substrate 502. That is, the interface between 516 and 526 is inside Si substrate 502.

Functional Description

Figure 7:
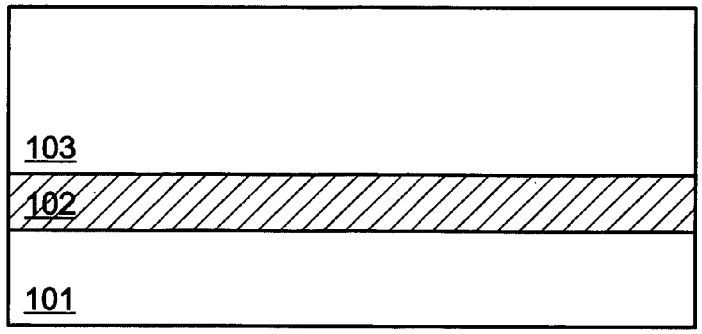
FIGS. 7 though 11 depict steps in the fabrication of the devices shown in FIGS. 5 and 6.

FIGS. 7 though 11 depict steps in the fabrication of the devices shown in FIGS. 5 and 6. The process starts from a silicon wafer and forms three layers (101, 102, and 103) on the silicon substrate, see FIG. 7. There are many methods of forming these three layers. Eight examples are presented below.

EXAMPLE 1

Use a p-type silicon substrate with boron concentration between 1e15 ($1 \times 10^{15}$) to 5e16 cm$^{-3}$. The boron ion implantation energy is 2-4 MeV and the dosage is between 1e12 and 5e13 cm$^{-2}$.

101: substrate boron concentration—1e15 to 5e16 cm$^{-3}$;
102: boron ion implantation concentration—5e16 to 1e19 cm$^{-3}$, and a thickness of 0.5 µm to 2 µm;
103: substrate boron concentration—1e15 to 5e16 cm$^{-3}$ and a thickness of 2.0 µm to 5 µm.

EXAMPLE 2

Use a p-type silicon substrate with a boron concentration between 1e15 to 5e16 cm$^{-3}$. Boron ion implantation to the surface layer of the wafer, using an ion implantation energy of 10 keV to 400 keV and a dosage of 1e12 to 5e13 cm$^{-2}$. Then, grow epitaxial Si to a thickness of about 2.0 µm to 5 µm.

101: substrate boron concentration—1e15 to 5e16 cm$^{-3}$;
102: boron ion implantation concentration—5e16 to 1e19 cm$^{-3}$ and a thickness of 0.5 µm to 5 µm.
103: grow a silicon epitaxial layer with a boron concentration 1e15 to 5e16 cm$^{-3}$ and a thickness of 2.0 µm to 5 µm.

EXAMPLE 3

Use an n-type silicon substrate with a phosphorus concentration between 1e15 to 5e16 cm$^{-3}$. Boron ion implant to the surface layer of the wafer, using an ion implantation energy of 10 keV to 400 keV and a dose of 1e12 to 5e13 cm$^{-2}$. Then, grow a silicon epitaxy layer to a thickness of 2.0 µm to 5 µm.

101: substrate phosphorous concentration—1e15 to 5e16 cm$^{-3}$;
102: boron ion implantation concentration—5e16 to 1e19 cm$^{-3}$ and a thickness of 0.5 µm to 5 µm;
103: silicon epitaxial layer with a boron concentration 1e15 to 5e16 cm$^{-3}$ and a thickness of 2.0 µm to 5 µm.

EXAMPLE 4

Use a p-type silicon substrate with a boron concentration between 1e16 to 1e19 cm$^{-3}$. Then, grow a silicon epi layer to a thickness of 2.0 µm to 5 µm.

101/102: substrate boron concentration—1e16 to 1e19 cm$^{-3}$
103: silicon epitaxial layer with a boron concentration of 1e15 to 5e16 cm$^{-3}$ and a thickness of 2.0 µm to 5 µm.

EXAMPLE 5

Use a n-type silicon substrate with phosphorous concentration between 1e15 to 5e16 cm$^{-3}$. The boron ion implantation energy is 2-4 MeV and the dosage is between 1e12 and 5e13 cm$^{-2}$.

101: substrate phosphorous concentration—1e15 to 5e16 cm$^{-3}$;
102: boron ion implantation concentration—5e16 to 1e19 cm$^{-3}$, and a thickness of 0.5 µm to 2 µm;
103: substrate phosphorous concentration—1e15 to 5e16 cm$^{-3}$ and a thickness of 2.0 µm to 5 µm.

EXAMPLE 6

Use a p-type silicon substrate with a boron concentration between 1e15 to 5e16 cm$^{-3}$. Boron ion implantation to the surface layer of the wafer, using an ion implantation energy of 10 keV to 400 keV and a dosage of 1e12 to 5e13 cm$^{-2}$. Then, grow epitaxial Si to a thickness of about 2.0 µm to 5 µm.

101: substrate boron concentration—1e15 to 5e16 cm$^{-3}$;
102: boron ion implantation concentration—5e16 to 1e19 cm$^{-3}$ and a thickness of 0.5 µm to 5 µm.
103: grow a silicon epitaxial layer with a phosphorous concentration 1e15 to 5e16 cm$^{-3}$ and a thickness of 2.0 µm to 5 µm.

EXAMPLE 7

Use an n-type silicon substrate with a phosphorus concentration between 1e15 to 5e16 cm$^{-3}$. Boron ion implant to the surface layer of the wafer, using an ion implantation energy of 10 keV to 400 keV and a dose of 1e12 to 5e13 cm$^{-2}$. Then, grow a silicon epitaxy layer to a thickness of 2.0 µm to 5 µm.

101: substrate phosphorous concentration—1e15 to 5e16 cm$^{-3}$;
102: boron ion implantation concentration—5e16 to 1e19 cm$^{-3}$ and a thickness of 0.5 µm to 5 µm;
103: silicon epitaxial layer with a phosphorous concentration 1e15 to 5e16 cm$^{-3}$ and a thickness of 2.0 µm to 5 µm.

EXAMPLE 8

Use a p-type silicon substrate with a boron concentration between 1e16 to 1e19 cm$^{-3}$. Then, grow a silicon epi layer to a thickness of 2.0 µm to 5 µm.

101/102: substrate boron concentration 1e16 to 1e19 cm$^{-3}$
103: silicon epitaxial layer with a phosphorous concentration of 1e15 to 5e16 cm$^{-3}$ and a thickness of 2.0 µm to 5 µm.

Figure 8:
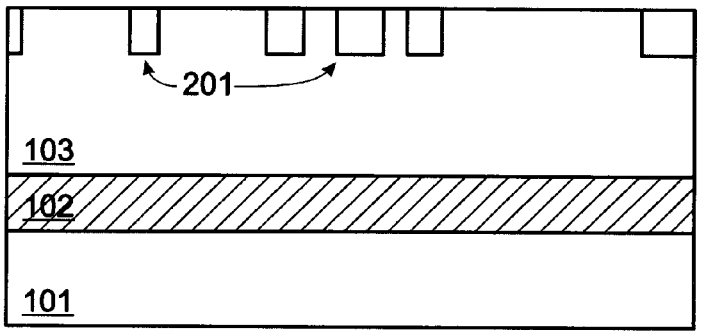

In FIG. 8, a shallow trench isolation (STI) process is performed on the wafer. Trenches 201 are STI filled with SiO$_2$.

Figure 9:
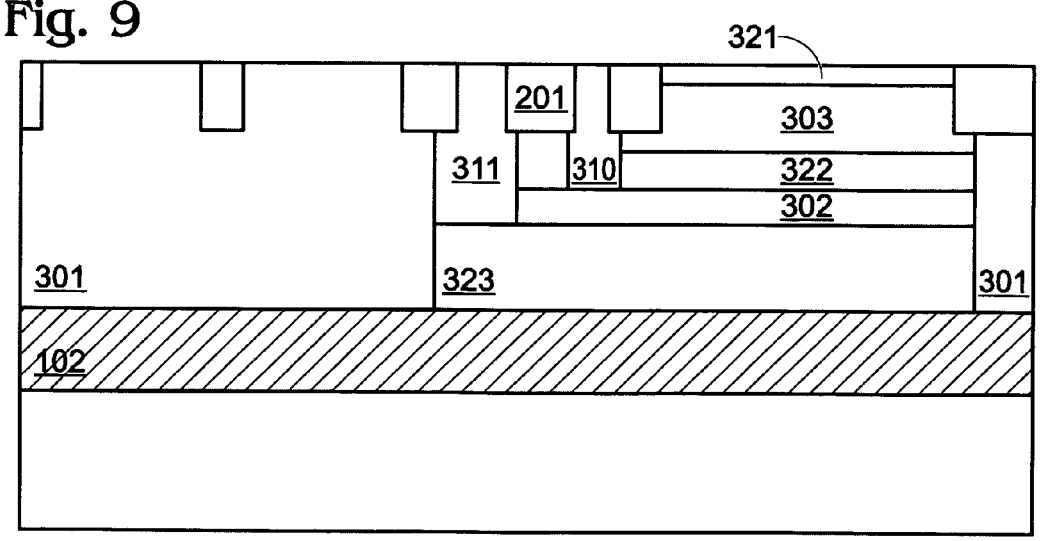

In FIG. 9, multiple ion implantation steps form the structure as following:

301, 302, and 303 are moderately (p) boron doped areas with a boron concentration of 5e16 to 1e19 cm$^{-3}$;

321, 322, and 323 are lightly (p−) boron doped areas with a boron concentration of 1e15 to 5e16 cm$^{-3}$; and, 310 and 311 are moderately (n) phosphorous doped areas with a phosphorus concentration of 5e16 to 1e19 cm$^{-3}$.

The thicknesses of the layers are as follows:

321: 0.3±0.2 μm;
303: 0.4±0.3 μm;
322: 0.6±0.5 μm;
302: 0.5±0.5 μm;
323: 1.0 to 4.0 μm; and,
301: 2-5 μm.

Layers 310 and 311 may be processed together. Layer 303 covers the bottom edge of the STI structure 201.

Figure 10:
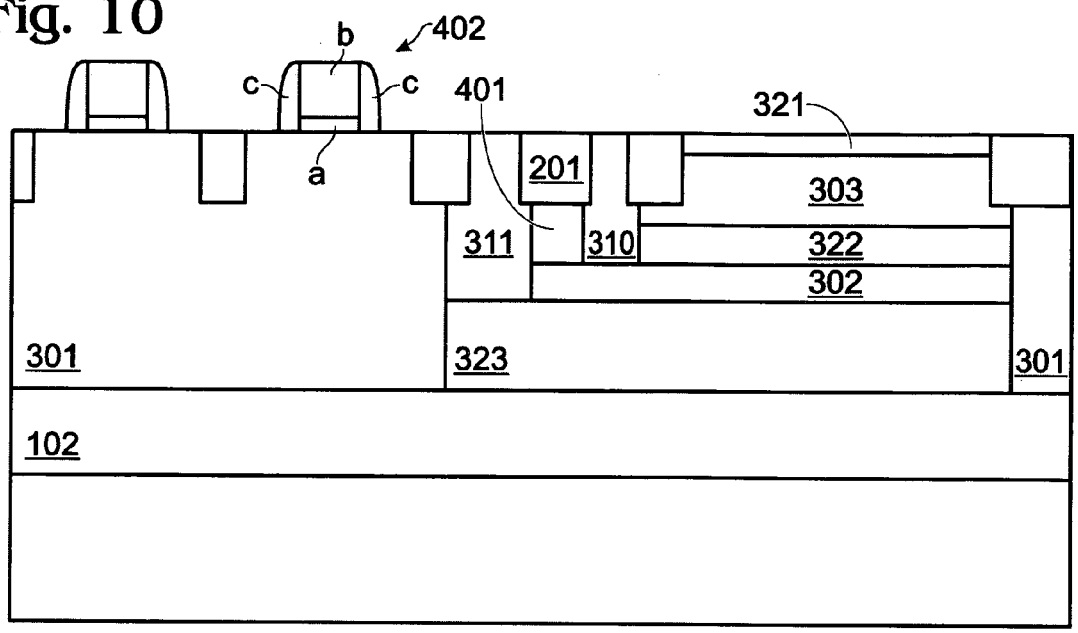

In FIG. 10, boron ions are implanted into area 401 to isolate layer 310 from 311. Area 401 has a boron concentration of between 5e16 to 1e19 cm$^{-3}$. The pixel transistors that are used to enable the photodiodes (e.g., NMOS 402) may be fabricated on area 301. 402a is the gate dielectric, 402b is the gate, and 403c are gate spacers. Note that area 301 has a boron concentration of between 5e16 to 1e19 cm$^{-3}$, which is suitable for fabricating n-channel devices, and also suitable for pixel isolation from a neighboring pixel. Area 301 is the same as the areas marked 510 and 540 in FIGS. 5 and 6. The STI isolation is not always necessary in the photodiode set area, but is typically required in area 301 for pixel transistor isolation. The isolation between the triple cathodes is solely dependent upon the p doped Si layers if STI isolation is not used in the photodiode set area.

Figure 11:
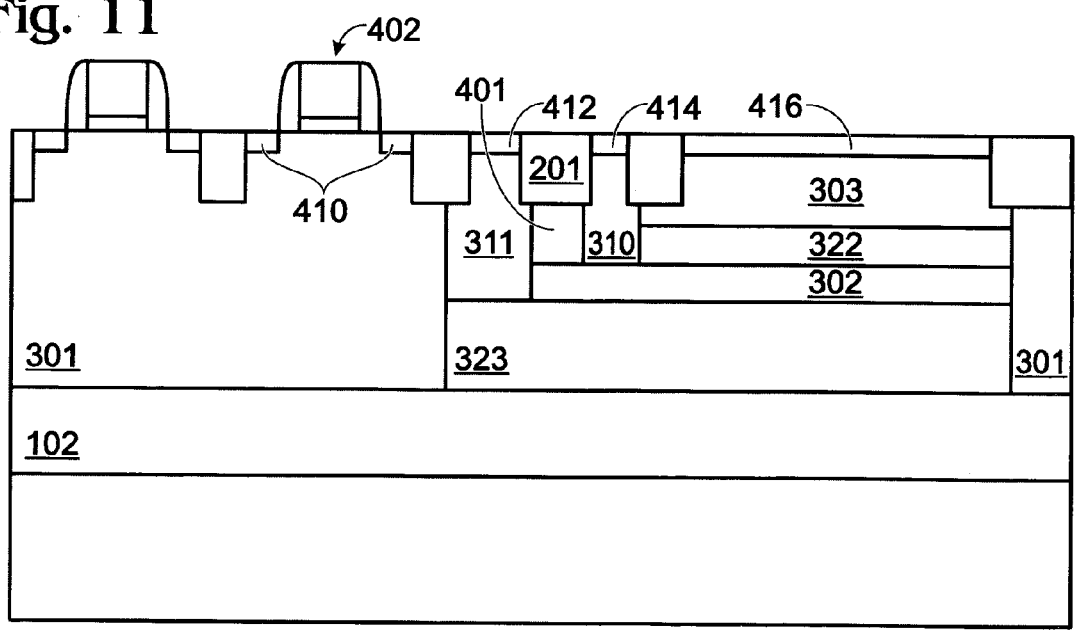

In FIG. 11, a self aligned n+ ion implantation is performed for the source/drain (S/D) regions 410 of NMOS transistor 402, as well as for the n+ cathodes (412, 414, and 416) of the photodiodes.

Photons (blue light) absorbed in junction 416/303 generate electron and hole pairs. Electrons are collected at cathode 416. Holes flow to region 303, then to region 301, and are collected to a common ground. Photons (green light) absorbed in region 322 generate electron and hole pairs. Electrons flow to 310, and then collect to cathode 414. Holes flow to regions 302 and 303, then to region 301, and are collected to a common ground. Photons (red light) absorbed in region 323 generate electron and hole pairs. Electrons flow to region 311, and then collect to cathode 412. Holes flow to regions 302 and 102, then to region 301, and are collected to a common ground.

Photons absorbed in the photodiode set area (from the top 416 to the bottom 323) in FIG. 11 do not contribute any electrical signal to the neighboring photodiode set because regions 301 and 102 are potential barriers for electrons. The electron barrier height is about 0.2 eV for p to p-junctions, and is about 0.8 eV for p to n junction. Thus, a fully isolated pixel can be realized with this structure.

Figure 12:
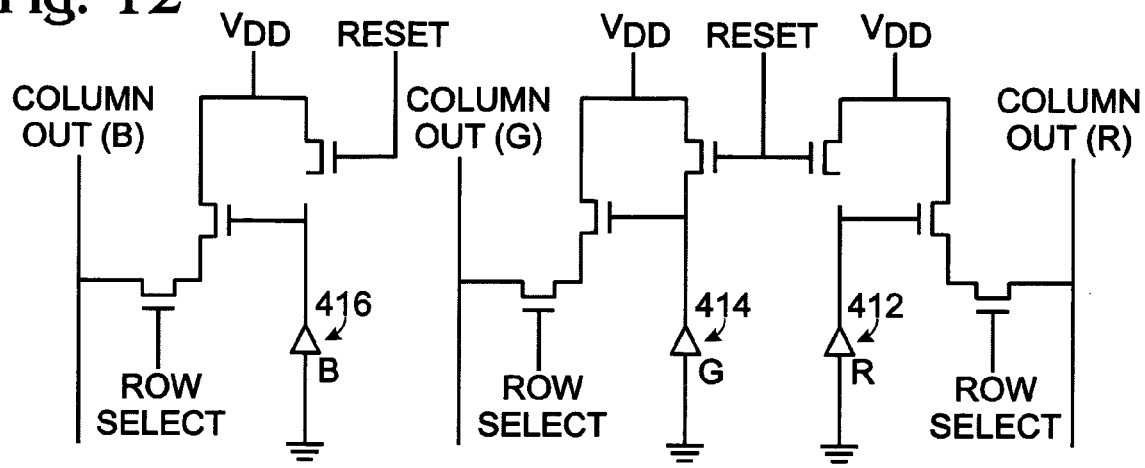
FIG. 12 is a schematic diagram depicting an active pixel sensor (APS) circuit with nine transistors that may be used to enable the photodiode sets of FIGS. 5, 6, and 11.

FIG. 12 is a schematic diagram depicting an active pixel sensor (APS) circuit that may be used to enable the photodiode sets of FIGS. 5, 6, and 11. This APS is similar to a conventional three-transistor (3T) APS circuit which includes a row select transistor, a source follower amplifier, and a reset transistor for each photodiode.

Figure 14:
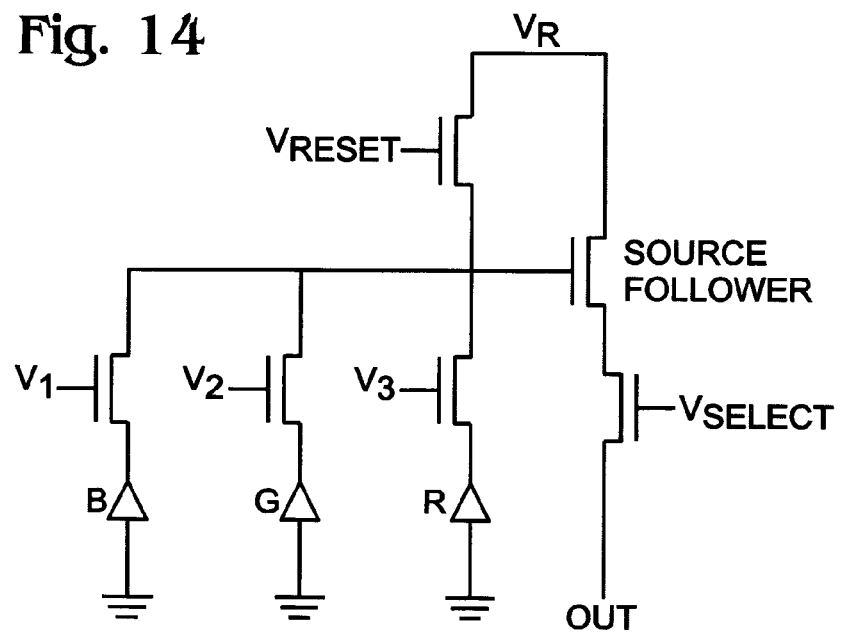
FIG. 14 is a schematic diagram depicting an APS circuit with 6 transistors that may be used to enable the photodiode sets of FIGS. 5, 6, and 11.

FIG. 14 is a schematic diagram depicting an APS circuit with 6 transistors that may be used to enable the photodiode sets of FIGS. 5, 6, and 11. The circuit includes transfer transistors V1, V2, and V3, one source follower transistor, one reset transistor, and one select transistor. This circuit is similar to the circuit disclosed in the parent application, entitled "WIDE OUTPUT SWING CMOS IMAGER", invented by Lee et al., Ser. No. 11/416,742, filed May 3, 2006. However, in the example shown, all pixel transistors are NMOS.

Figure 13:
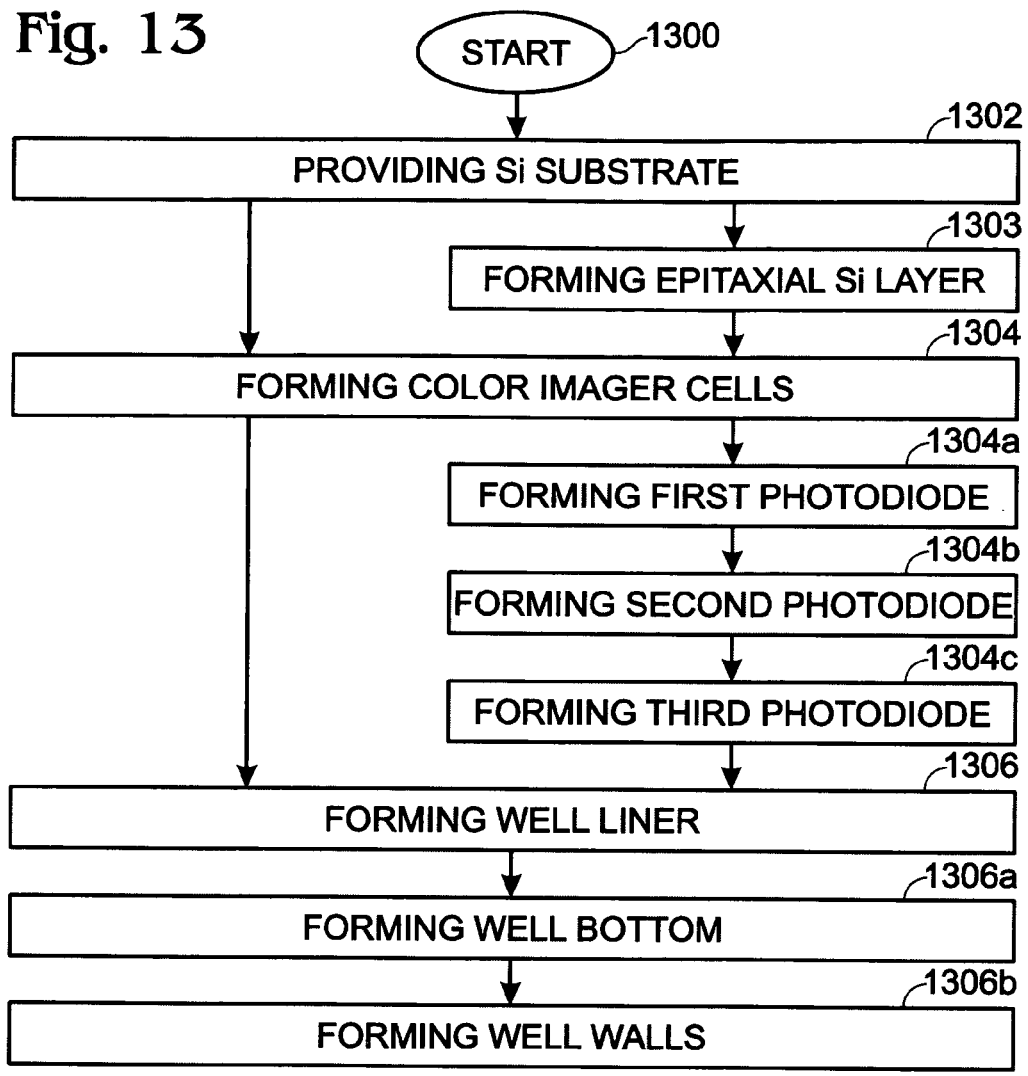
FIG. 13 is a flowchart illustrating a method for forming an array of fully isolated multi-junction CMOS filterless color imager cells.
Figure 15:
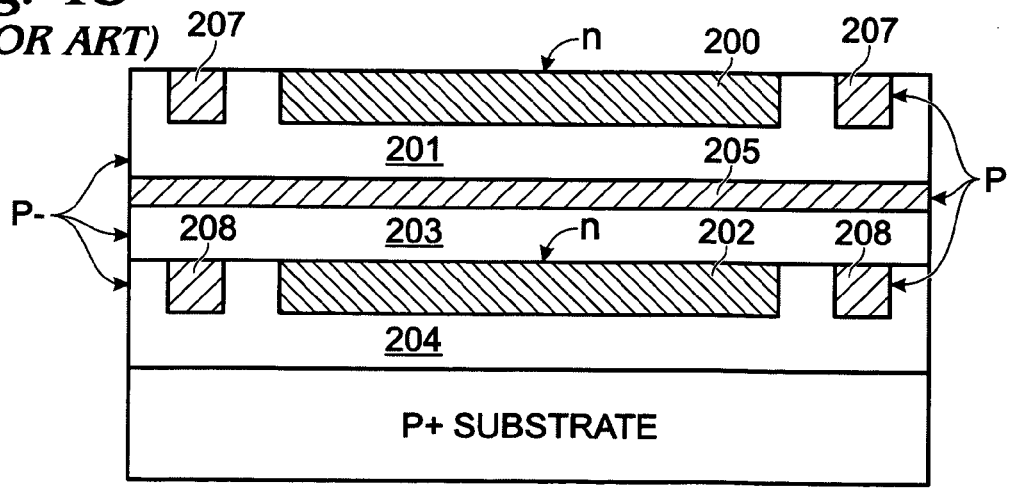
FIG. 15 is a partial cross-sectional view of a triple cathode photodiode set with partial isolation (prior art).

FIG. 13 is a flowchart illustrating a method for forming an array of fully isolated multi-junction CMOS filterless color imager cells. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1300.

Step 1302 provides a bulk Si substrate. Step 1304 forms a plurality of color imager cells, where each color imager cell includes a photodiode set with a first, second, and third photodiode formed as a stacked multi-junction structure. Step 1306 forms a U-shaped (as seen in cross-section) well liner, fully isolating the photodiode set from adjacent photodiode sets in the array.

In one aspect, prior to forming the well liner first and second walls, and the photodiode set, Step 1303 forms an epitaxial layer of Si overlying the Si substrate. Then, forming the photodiode set in Step 1304 includes forming the photodiode set in the epitaxial Si layer. Step 1306 may include forming a portion of the well liner in the epi Si. Alternately, Step 1304 forms the photodiode set in the Si substrate, and Step 1306 forms the well liner in the Si substrate.

Typically, Step 1304 forms each photodiode with a doped Si layer physically interfaced to the well liner. Step 1306 forms a well liner first wall physically interfaced to a doped Si layer of each photodiode. For example, Step 1304 may form each photodiode with a p doped Si layer physically interfaced to the well liner, and Step 1306 may form a p doped well liner electrically connected to a reference voltage (common ground). In one aspect, Step 1306 forms a well bottom physically interfaced to the first wall, and Step 1304 forms the third, bottom-most, photodiode with a p doped layer that is part of the well bottom.

More explicitly, Step 1304 may be organized as substeps, which are not necessarily chronologically ordered. Step 1304a forms the first photodiode with a first doped Si layer formed in a top surface region, and an underlying first p doped Si layer physically interfaced to the first wall. Step 1304b forms the second photodiode with a second doped Si layer underlying the first p doped Si layer, and an underlying second p doped Si layer physically interfaced to the first wall. Step 1304b also forms an n doped first vertical structure physically interfacing the second doped Si layer to a top surface region. Step 1304c forms the third photodiode with a third doped Si layer underlying the second p doped Si layer, and an underlying third p doped Si layer physically interfaced to the first wall and forming a portion of the well bottom. Step 1304c forms an n doped second vertical structure physically interfacing the third doped Si layer to a top surface region.

In one aspect, Step 1306 forms a p doped second wall physically interfaced to the second vertical structure, the third doped Si layer, and the well bottom. In another aspect, the first, second, and third doped Si layers formed in Step 1304a, 1304b, and 1304c, respectively, are n doped Si layers. Alternately, Step 1304a forms a first n doped Si layer, while Steps 1304b and 1304c form second and third p−doped Si layers, respectively.

In one aspect, forming the well liner in Step 1306 includes substeps. Prior to forming the photodiode set doped Si layers, Step 1306a p dopes a horizontal layer of the Si substrate, forming the well bottom. Step 1306b p dopes vertical sections, forming the well liner first and second walls. See the explanation of FIGS. 7-11 for the chronological order of steps. Forming the well bottom (Step 1306*a*) includes:

doping with a boron concentration in a range of $5 \times 10^{16}$ to $1 \times 10^{19}$ per cubic centimeter ($cm^{-3}$);

forming a well bottom layer with a thickness in a range of about 0.5 to 2 microns; and, forming the well bottom a depth in a range of about 2 to 6 microns below the top surface.

Forming the well liner first and second wall in Step 1306*b* includes:

doping with a boron concentration in a range of $5 \times 10^{16}$ to $1 \times 10^{19}$ $cm^{-3}$; and, forming vertical structures extending a depth in a range of about 2 to 6 microns below the top surface.

Some fully isolated multifunction CMOS imager cell variations have been provided, fabricated in a bulk Si substrate, or with a single epi Si layer. Example of particular dopant layered structures, dosages, concentrations, energies, and layer thickness have been presented to illustrate the invention. However, the invention is not limited to merely these examples. It will be appreciated that further variations and modifications thereof may be made within the scope of the invention as defined in the appended claims.

We claim:

1. An array of fully isolated multi-junction complimentary metal-oxide-semiconductor (CMOS) filterless color imager cells, the color imager cell array comprising:
    a bulk silicon (Si) substrate;
    a single layer of epitaxial Si overlying the substrate, including a plurality of color imager cells, where each color imager cell includes a photodiode set with a first, second, and third photodiode formed as a stacked multi-junction structure; and,
    a U-shaped well liner, fully isolating each photodiode set from adjacent photodiode sets in the array.

2. The color imager cell array of claim 1 wherein each photodiode includes a doped Si layer physically interfacing the well liner.

3. The color imager cell array of claim 2 wherein the well liner includes a first wall physically interfacing a doped Si layer of each photodiode in the photodiode set.

4. The color imager cell array of claim 3 wherein each photodiode includes a p doped Si layer physically interfacing the first wall; and,
    wherein the well liner is p doped and electrically connected to a reference voltage.

5. The color imager cell array of claim 4 wherein the well liner includes a well bottom physically interfacing the first wall; and,
    wherein the third, bottom-most, photodiode includes a p doped layer that is part of the well bottom.

6. The color imager cell array of claim 5 wherein the first photodiode includes a first doped Si layer formed in a top surface region, and an underlying first p doped Si layer physically interfacing the first wall;
    wherein the second photodiode includes a second doped Si layer underlying the first p doped Si layer, an underlying second p doped Si layer physically interfacing the first wall, and an n doped first vertical structure physically interfacing the second doped Si layer to a top surface region; and,
    wherein the third photodiode includes a third doped Si layer underlying the second p doped Si layer, an underlying third p doped Si layer physically interfacing the first wall and forming a portion of the well bottom, and an n doped second vertical structure physically interfacing the third doped Si layer to a top surface region.

7. The color imager cell array of claim 6 wherein the well liner includes a p doped second wall physically interfacing the second vertical structure, the third doped Si layer, and the well bottom.

8. The color imager cell array of claim 7 wherein the first, second, and third doped Si layers are n doped.

9. The color imager cell array of claim 6 wherein the first doped Si layer is n doped, and the second and third Si layers are p doped.

10. The color imager cell array of claim 6 further comprising:
    isolating structures separating the first and second vertical structures, and separating the first vertical structure and the first doped Si layer, the isolating structures selected from a group consisting of dielectric material, p doped Si, and combinations of dielectric material and p doped Si.

11. The color imager cell array of claim 1 wherein the photodiode set multi-junction structure is formed in the Si substrate.

12. A method for forming an array of fully isolated multi-junction complimentary metal-oxide-semiconductor (CMOS) filterless color imager cells, the method comprising:
    providing a bulk silicon (Si) substrate;
    forming a layer of epitaxial Si overlying the substrate;
    forming a plurality of color imager cells, where each color imager cell includes a photodiode set formed in the epitaxial Si layer, with a first, second, and third photodiode formed as a stacked multi-junction structure; and,
    forming a U-shaped well liner, fully isolating each photodiode set from adjacent photodiode sets in the array.

13. The method of claim 12 wherein forming the photodiode set includes forming each photodiode with a doped Si layer physically interfaced to the well liner.

14. The method of claim 13 wherein forming the well liner includes forming a well liner first wall physically interfaced to a doped Si layer of each photodiode.

15. The method of claim 14 wherein forming the photodiodes includes forming each photodiode with a p doped Si layer physically interfaced to the well liner; and,
    wherein forming the well liner includes forming a p doped well liner electrically connected to a reference voltage.

16. The method of claim 15 wherein forming the well liner includes forming a well bottom physically interfaced to the first wall; and,
    wherein forming the photodiodes includes forming the third, bottom-most, photodiode with a p doped layer that is part of the well bottom.

17. The method of claim 16 wherein forming the first photodiode includes forming the first photodiode with a first doped Si layer formed in a top surface region, and an underlying first p doped Si layer physically interfaced to the first wall;
    wherein forming the second photodiode includes forming the second photodiode with a second doped Si layer underlying the first p doped Si layer, an underlying second p doped Si layer physically interfaced to the first wall, and an n doped first vertical structure physically interfacing the second doped Si layer to a top surface region; and,
    wherein forming the third photodiode includes forming a third doped Si layer underlying the second p doped Si layer, an underlying third p doped Si layer physically interfaced to the first wall and forming a portion of the well bottom, and an n doped second vertical structure physically interfacing the third doped Si layer to a top surface region.

18. The method of claim 17 wherein forming the well liner includes forming a p doped second wall physically interfaced to the second vertical structure, the third doped Si layer, and the well bottom.

19. The method of claim 17 wherein forming the photodiode set includes forming first, second, and third n doped Si layers.

20. The method of claim 17 wherein forming the photodiode set includes forming a first n doped Si layer, and second and third p doped Si layers.

21. The method of claim 17 wherein forming the well liner includes:
   prior to forming the photodiode set doped Si layers, p doping a horizontal layer of the Si substrate, forming the well bottom; and
   p doping vertical sections, forming the well liner first and second walls.

22. The method of claim 21 wherein forming the well bottom includes:
   doping with a boron concentration in a range of $5 \times 10^{16}$ to $1 \times 10^{19}$ per cubic centimeter ($cm^{-3}$);
   forming a well bottom layer with a thickness in a range of about 0.5 to 2 microns; and,
   forming the well bottom a depth in a range of about 2 to 6 microns below the top surface.

23. The method of claim 21 wherein forming the well liner first and second wall includes:
   doping with a boron concentration in a range of $5 \times 10^{16}$ to $1 \times 10^{19}$ $cm^{-3}$; and,
   forming vertical structures extending a depth in a range of about 2 to 6 microns below the top surface.

24. The method of claim 12 wherein forming the photodiode set includes forming the photodiode set in the Si substrate.

* * * * *